United States Patent
Takiar et al.

(10) Patent No.: US 8,461,675 B2
(45) Date of Patent: Jun. 11, 2013

(54) SUBSTRATE PANEL WITH PLATING BAR STRUCTURED TO ALLOW MINIMUM KERF WIDTH

(75) Inventors: Hem Takiar, Fremont, CA (US); Ken Jian Ming Wang, San Francisco, CA (US); Chih-Chin Liao, Changhua (TW); Han-Shiao Chen, Da-an Township, Taichung County (TW)

(73) Assignee: SanDisk Technologies Inc., Plano, TX (US)

( * ) Notice: Subject to any disclaimer, the term of this patent is extended or adjusted under 35 U.S.C. 154(b) by 417 days.

(21) Appl. No.: 11/301,715

(22) Filed: Dec. 13, 2005

(65) Prior Publication Data

US 2007/0132066 A1 Jun. 14, 2007

(51) Int. Cl.
*H01L 23/52* (2006.01)
*H01L 23/48* (2006.01)

(52) U.S. Cl.
USPC ........... 257/691; 257/692; 257/698; 257/773; 257/786; 257/E23.079; 257/620

(58) Field of Classification Search
USPC .......... 257/691, 692, 666, 670, 673, 676, 257/690, 693, 694, 695, 697, 698, 620, 773, 257/786, E23.001, E23.002, E23.031, E23.032, 257/E23.033, E23.034, E23.035, E23.036, 257/E23.043, E23.044, E23.045, E23.046, 257/E23.047, E23.048, E23.049, E23.05, 257/E23.079, E23.141, E23.151, E23.152, 257/E23.153; 438/462
See application file for complete search history.

(56) References Cited

U.S. PATENT DOCUMENTS

| | | | | |
|---|---|---|---|---|
| 5,467,252 A | * | 11/1995 | Nomi et al. | 361/760 |
| RE36,773 E | * | 7/2000 | Nomi et al. | 361/760 |
| 6,281,047 B1 | | 8/2001 | Wu et al. | |
| 6,319,750 B1 | * | 11/2001 | Huang et al. | 438/106 |
| 6,479,887 B1 | * | 11/2002 | Yoon et al. | 257/666 |
| 7,064,419 B1 | * | 6/2006 | Bayan et al. | 257/666 |
| 7,087,986 B1 | * | 8/2006 | Bayan et al. | 257/676 |
| 7,098,524 B2 | | 8/2006 | Wu et al. | |
| 7,235,864 B2 | | 6/2007 | Lee | |
| 2002/0074650 A1 | * | 6/2002 | Takahashi et al. | 257/723 |
| 2002/0145178 A1 | | 10/2002 | Tsao et al. | |
| 2002/0145517 A1 | | 10/2002 | Papallo, Jr. et al. | |
| 2003/0150110 A1 | | 8/2003 | Kang et al. | |
| 2005/0051881 A1 | | 3/2005 | Chen et al. | |

(Continued)

FOREIGN PATENT DOCUMENTS

| | | |
|---|---|---|
| EP | 0757381 A1 | 2/1997 |
| KR | 1019980020175 A | 6/1998 |
| KR | 1020060009087 A | 1/2006 |
| TW | 200739861 | 10/2007 |

OTHER PUBLICATIONS

Communication Relating to the Results of the Partial International Search dated Jul. 7, 2007, in PCT Application No. PCT/US2006/047206.

(Continued)

*Primary Examiner* — Nitin Parekh
(74) *Attorney, Agent, or Firm* — Vierra Magen Marcus LLP

(57) ABSTRACT

A semiconductor die substrate panel is disclosed including a minimum kerf width between adjoining semiconductor package outlines on the panel, while ensuring electrical isolation of plated electrical terminals. By reducing the width of a boundary between adjoining package outlines, additional space is gained on a substrate panel for semiconductor packages.

18 Claims, 6 Drawing Sheets

U.S. PATENT DOCUMENTS

2007/0132066 A1    6/2007   Takiar et al.
2007/0155247 A1*  7/2007   Takiar et al. .................. 439/660
2007/0267759 A1*  11/2007 Liao et al. ..................... 257/786

OTHER PUBLICATIONS

International Search Report and Written Opinion dated Dec. 24, 2008 in PCT Application No. PCT/US2008/066100.
Office Action dated Feb. 20, 2009, U.S. Appl. No. 11/760,385.
Response to Office Action filed May 20, 2009 in U.S. Appl. No. 11/760,385.
Notice of Allowance and Fee(s) Due dated Jul. 20, 2009 in U.S. Appl. No. 11/760,385.
Office Action dated Dec. 1, 2010 in Chinese Application No. 200880019350.5.
Response to Office Action filed Jun. 29, 2010 in Taiwanese Application No. 095146479.
Response to Office Action filed Jul. 26, 2010 in U.S. Appl. No. 11/760,405.
Office Action dated Dec. 7, 2010 in U.S. Appl. No. 11/760,405.
Response to Final Office Action filed Apr. 2, 2012 in U.S. Appl. No. 11/760,405.
Office Action dated Apr. 18, 2011 in Korean Application No. 10-2010-7000149.
Final Office Action mailed Aug. 2, 2011 in U.S. Appl. No. 11/760,405.
Response to Office Action filed Jul. 18, 2011 in Korean Application No. 10-2010-7000149.
Search Report dated Sep. 3, 2011 in Taiwanese Patent Application No. 097121311.
English Abstract and Bibliographic Information for TW200739861 published Oct. 16, 2007.
Office Action Jan. 25, 2010 in U.S. Appl. No. 11/760,405.
Response to Office Action filed May 9, 2011 in U.S. Appl. No. 11/760,405.
Response to Office Action filed Apr. 17, 2011 in Chinese Application No. 200880019350.5.
Office Action dated Apr. 2, 2010 in Taiwanese Application No. 095146479.
Office Actiion dated Mar. 18, 2013 in U.S. Appl. No. 11/760,405.

* cited by examiner

*Fig. 14*
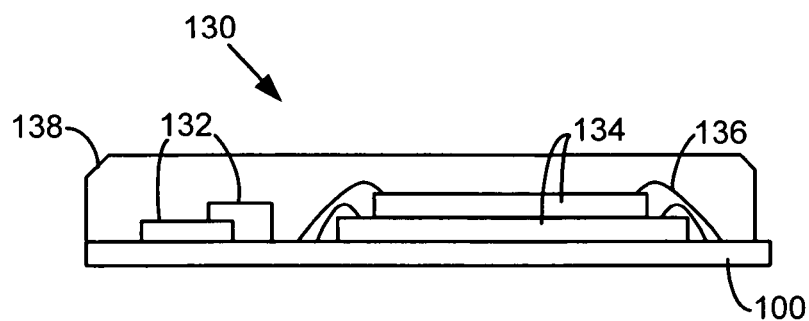
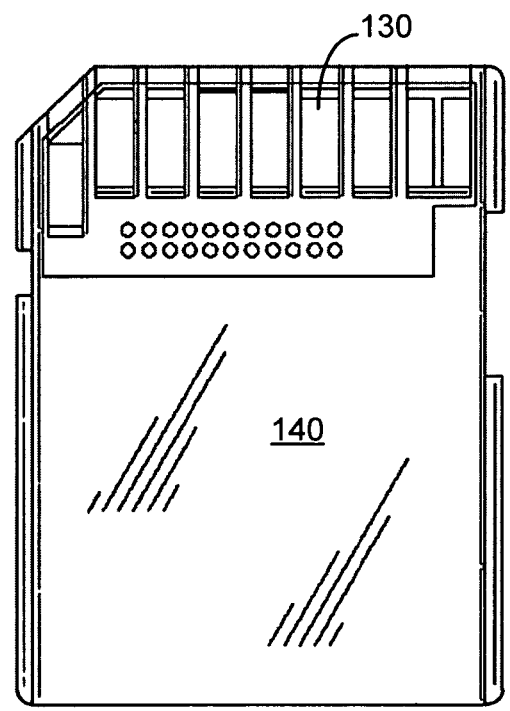
*Fig. 15*

SUBSTRATE PANEL WITH PLATING BAR STRUCTURED TO ALLOW MINIMUM KERF WIDTH

BACKGROUND OF THE INVENTION

1. Field of the Invention

Embodiments of the present invention relate to a semiconductor die substrate panel including a minimum kerf width between adjoining semiconductor package outlines on the panel, while ensuring electrical isolation of plated contacts.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate. The substrate may in general include a rigid, dielectric base having a conductance pattern, generally of copper or copper alloy, etched on respective sides. Electrical connections are formed between the die and the conductance pattern(s), and the conductance patterns(s) provide an electric lead structure for communication between the die and an external electronic system. Once electrical connections between the die and substrate are made, the assembly is then typically encased in a molding compound to form a protected semiconductor package.

While the copper conductance patterns may be etched to high precision, the poor corrosion properties of copper make it undesirable for certain applications. In the presence of moisture, air and chlorine, bare copper is readily tarnished, making it unsuitable for subsequent soldering and die attach operations. Similarly, certain packages, such as land grid array (LGA) and ball grid array (BGA) packages include contact fingers formed on a lower surface of the package and exposed outside of the package for establishing electrical connection between the package and an external electronic device. If the contact fingers were formed of bare copper, tarnishing and corrosion would damage the fingers over time.

It is therefore known to plate copper leads at their solder or through-hole points, and at the contact fingers. Various plating processes are known for applying a thin film of resistive material, such as tin, tin-lead, nickel and gold. In one such process, a resistive material such as gold may be selectively plated onto the conductance pattern in an electroplating process. Referring to prior art FIG. 1, an electroplating process may result in a plurality of gold plating tails 20 on a substrate 22. The plating tails 20 may terminate at solder pads 24, through-holes 26, and contact fingers 28 provided for external electrical communication. Not all of the plating tails 20, pads 24 and fingers 28 are numbered in FIG. 1. Plating tails 20 and solder pads 24 shown in dashed lines in FIG. 1 are located on the underside of substrate 22. The substrate 22 further includes plating bars 30 for shorting together the various tails 20, pads 24, through-holes 26 and fingers 28 during the electroplating process.

In performing the electroplating process, the substrate 22 is immersed in a plating bath including metal ions in an aqueous solution. A current is supplied to the plating bars 30, which current travels through the plating tails 20, pads 24, through-holes 26 and fingers 28. When the current is delivered, the tails 20, pads 24, through-holes 26 and fingers 28 are electrified and a charge is created at their surface. The metal ions are attracted to the electrified and charged metal areas. In this way, a layer of gold or other plating metal of a desired thickness may be deposited.

After electroplating, the plating bar 30 is removed. It is important that the entire plating bar 30 is removed. When removing the plating bar, if for example a sliver or portion of the plating bar is left, as shown in prior art FIG. 2, this may result in certain tails being shorted together, such as for example tails 20a, 20b and 20c, and a malfunctioning of the integrated circuit formed thereby. In order to prevent this, a cutting blade, router or other device 32 used to remove the plating bar is provided with a large width, w, as shown in prior art FIG. 3. Ideally, the width of the removal device 32 would be no larger than the width of the plating bar, which may for example be approximately 3 to 5 mils. However, owing to engineering tolerances, the removal device 32 may not follow a straight path while removing the plating bar. For example, if the removal device (shown in dashed lines in FIG. 3) varies a distance, Δ, from a straight removal path, the removal device must still have a width large enough to completely remove the plating bar.

As a result of the large width of the removal device required, as well as the space required on either side of the plating bar for engineering tolerances in the removal process, a relatively large kerf width, k (FIGS. 1 and 3), must be provided around each plating bar. This large kerf width takes up space on substrate 22 which could otherwise be used for the circuit portion of the substrate.

It is known to also plate substrates in an electroless plating process which does not employ plating bars. In electroless plating, metal ions in an aqueous solution are deposited on a conductance pattern by a chemical reducing agent in solution instead of an electric charge. However, such electroless processes suffer from disadvantages including high expense and an inability to achieve precise patterning on the substrate.

SUMMARY OF THE INVENTION

Embodiments of the invention relate to a semiconductor die substrate panel including a minimum kerf width between adjoining semiconductor package outlines on the panel, while ensuring electrical isolation of plated electrical terminals. The substrate panel may be formed with a plating bar between adjoining package outlines on the panel. The substrate panel may further include plated electrical terminals, such as solder pads and contact fingers, and plating tails electrically coupling the electrical terminals to the plating bar.

After plating of the substrate panel is complete, the plating bar is severed at locations along its length to ensure that each of the electrical terminals is electrically isolated from each other. In one embodiment, the plating bar may have a stepped configuration with sections in both of the adjoining package outlines. The sections may be connected together by transverse connectors across the boundary between the package outlines to maintain electrical continuity within the plating bar. A given plating bar section in one of the package outlines may have a single tail which terminates in that same package outline, and a plurality of tails that terminate in an adjoining package outline. With such a configuration, when a cut is made between the package outlines, the cut will sever the transverse connectors between all plating bar sections, thus electrically isolating each of the electrical terminals from each other.

In embodiments, the plating bar sections extend generally parallel to their adjacent edge of the package outline in which the section resides. The transverse connectors between the plating bar sections may extend generally perpendicularly between the plating bar sections. However, in alternative embodiments, the plating bar sections need not be generally parallel to their adjacent edges of the package outlines, and the transverse connectors need not be generally perpendicular to the adjacent edges of the package outline.

Having a stepped, diagonal or otherwise discontinuous shaped plating bar provides an advantage that the kerf width between adjoining package outlines may have a thinner width than known in the prior art. First, as it is not necessary to remove the plating bar, the width of the cutting device need not be greater than the width of the plating bar. Second, because portions of the plating bar pass across the boundary between adjoining package outlines, even if the path of the cutting device varies from straight due to engineering tolerances, the cut will still sever the plating bar between adjoining package outlines to isolate the electrical terminals. Thus, the kerf width between adjoining package outlines may be reduced because the width of the cutting device may be made smaller and the space previously required for engineering tolerances may be omitted.

By reducing the width of the boundary between adjoining package outlines in accordance with the present invention, additional space is gained on a substrate panel for semiconductor packages. For example, a fraction of a package outline may be turned into a whole package outline. The addition of even a single row and/or column of semiconductor packages from a given size panel would result in a tremendous increase in semiconductor package yields.

BRIEF DESCRIPTION OF THE DRAWINGS

FIG. 14 is a cross-sectional side view of a semiconductor package formed with a substrate from a panel having a plating bar according to an embodiment of the present invention.

FIG. 15 is a rear view of a flash memory formed with the semiconductor package of FIG. 14.

DETAILED DESCRIPTION

Embodiments of the invention will now be described with reference to FIGS. 4 through 16, which relate to a semiconductor die substrate including a minimum kerf width cut between adjoining semiconductor package outlines on the panel, while ensuring electrical isolation of plated contacts. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
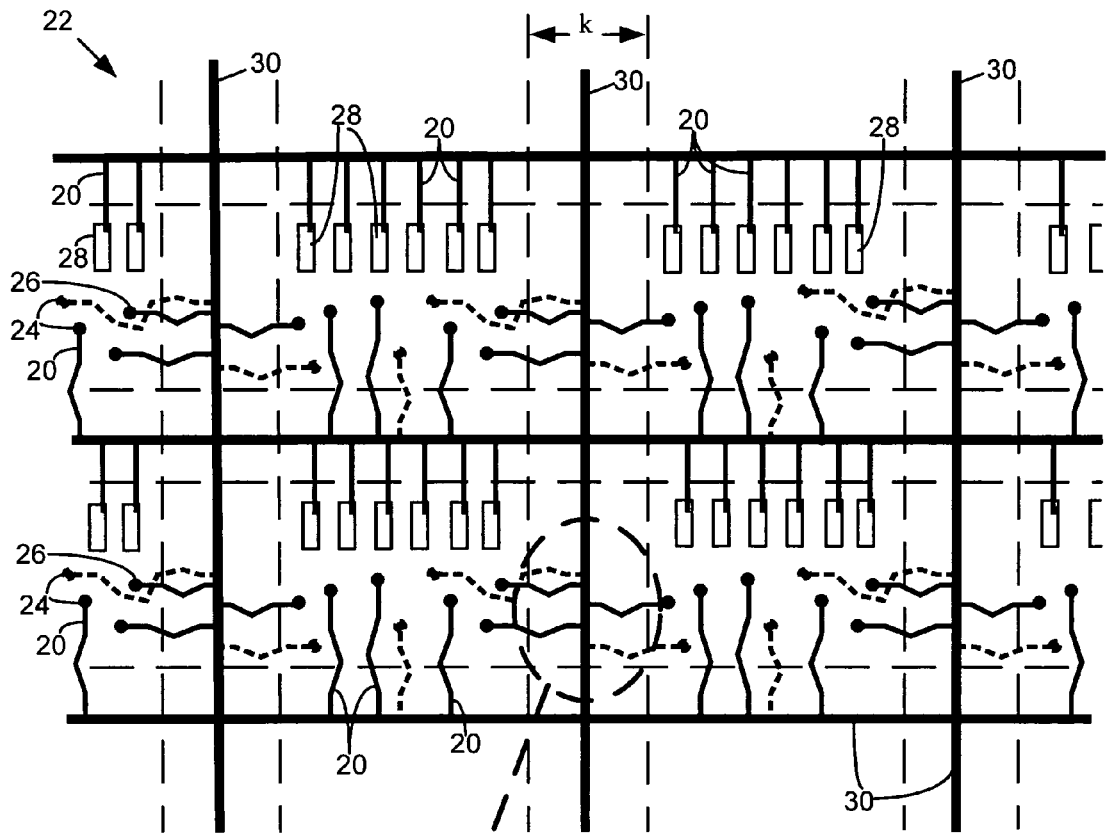
FIG. 1 is a prior art top view of a semiconductor die substrate including a plurality of package outlines and a conventional grid of plating bars.
Figure 2:
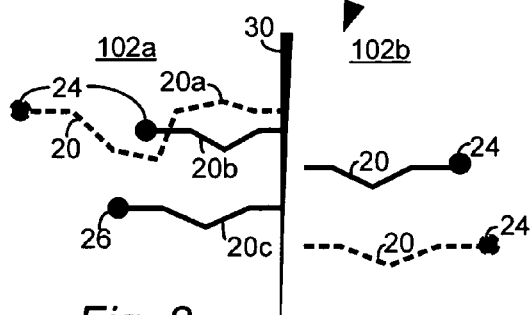
FIG. 2 is a prior art top view of a section of a semiconductor die substrate including a partially removed section of a plating bar.
Figure 3:
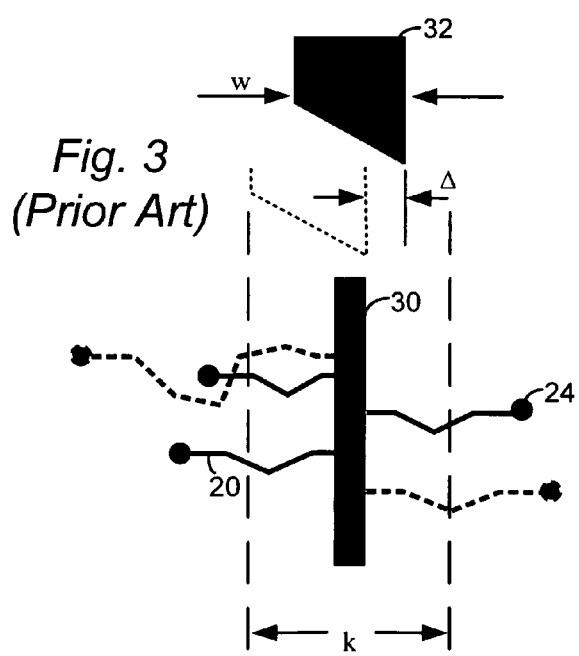
FIG. 3 is a prior art top view of a section of a semiconductor die substrate showing a kerf width required for a conventional plating bar removal device.
Figure 4:
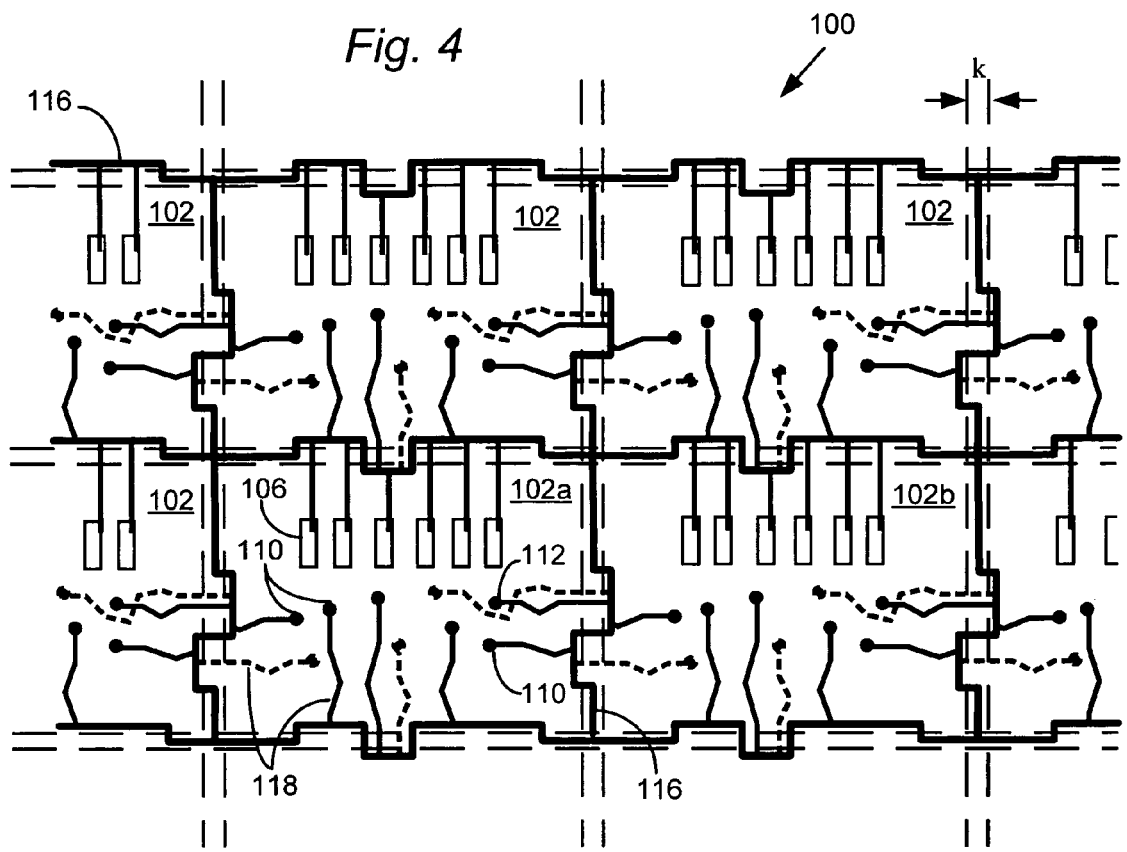
FIG. 4 is a top view of a semiconductor die substrate including a plurality of package outlines and a grid of plating bars according to an embodiment of the present invention.

Referring initially to the top view of FIG. 4, there is shown a substrate panel 100 including a plurality of package outlines 102. The package outlines define locations for the formation of the respective semiconductor packages on the substrate panel. The package outlines 102 may or may not be visibly discernible on the substrate panel 100.

Substrate panel 100 may be formed of a core, having a top and bottom conductive layer. The core may be formed of various dielectric materials such as for example, polyimide laminates, epoxy resins including FR4 and FR5, bismaleimide triazine (BT), and the like. Although not critical to the present invention, the core may have a thickness of between 40 microns (μm) to 200 μm, although thickness of the core may vary outside of that range in alternative embodiments. The core may be ceramic or organic in alternative embodiments.

The conductive layers may be formed of copper or copper alloys, plated copper or plated copper alloys, Alloy 42 (42Fe/58Ni), copper plated steel, or other metals and materials known for use on substrates. The layers may have a thickness of about 10 μm to 24 μm, although the thickness of the layers may vary outside of that range in alternative embodiments.

One or both of the conductive layers may be etched in a known photolithography process with a conductance pattern for signal and power communication. The conductance pattern on one side of the substrate panel 100 may include contact fingers 106 for establishing electrical connection between the finished semiconductor package and an external electronic device. The conductance pattern on one or both sides of the substrate panel 100 may include solder pads 110 where electrical contacts for surface mounted components such as semiconductor die are soldered to the substrate panel. Through-holes 112 may further be defined in the substrate panel 100 for electrical communication between the conductance patterns on opposed surfaces of the substrate panel. The conductance pattern on one or both sides of the substrate panel 100 may further include plating bars 116 and plating tails 118 used in a plating process as explained hereinafter.

Figure 16:
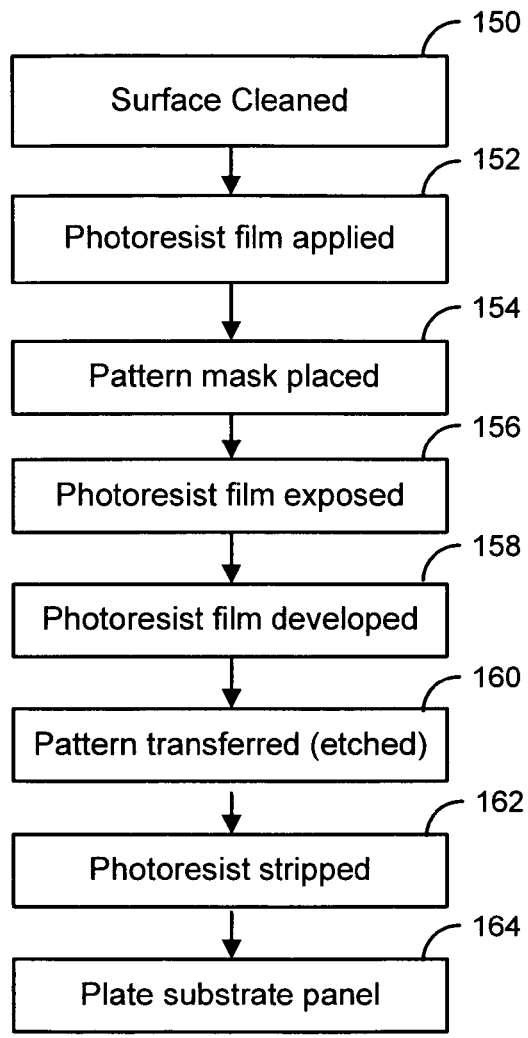
FIG. 16 is a flowchart for forming a conductance pattern and plating on the substrate panel.

One process for forming the conductance patterns including contact fingers 106, solder pads 110, through-holes 112, plating bars 116 and plating tails 118 on the substrate panel 100 is explained with reference to the flowchart of FIG. 16. The surfaces of the conductive layers are cleaned in a step 150. A photoresist film is then applied over the surfaces of the conductive layers in step 152. A pattern mask containing the outline of the electrical conductance pattern may then be placed over the photoresist film in step 154. The photoresist film is exposed (step 156) and developed (step 158) to remove the photoresist from areas on the conductive layers that are to be etched. The exposed areas are next etched away using an etchant such as ferric chloride in step 160 to define the conductance patterns on the core. Next, the photoresist is removed in step 162. Other known methods for forming the conductance pattern on substrate panel 100 are contemplated.

In step 164, after formation of the conductance pattern on one or both surfaces of the substrate panel 100, a layer of resistive metal may be plated on the electrical terminals of one or both conductance patterns on the substrate panel. In particular, electrical terminals of the conductance pattern that are to be plated may be shorted together, and those electrical terminals are electrically isolated from other portions which are not to be plated. The electrical terminals of the conductance pattern may include the contact fingers 106, solder pads 110 and through-holes 112. The electrical terminals are shorted together via the plating bars 116 and plating tails 118 formed on the substrate. Only package outline 102a is numbered in FIG. 4 for clarity. The same reference numbers apply to the remaining package outlines 102. Not all of the solder pads, through-holes and contact fingers are numbered in package outline 102a. Plating tails 118 and solder pads 110 shown in dashed lines in FIG. 4 are located on the underside of the substrate panel. Moreover, the panel 100 may include more solder pads, through-holes and/or contact fingers than shown. Although not shown, some of the electrical terminals may be formed electrically coupled to each other, and the electrical coupling between terminals subsequently broken to isolate each terminal in a known etch-back process.

The electrical terminals of the conductance pattern may be plated with a metal film, such as for example gold, in a known manner. Other metals, including tin, tin-lead and nickel may be plated onto the conductance pattern(s) in alternative embodiments. The width of the plating bars 116 may be determined by a known formula, but may be between 3 mils and 5 mils. The plating bars may be thinner or thicker than that in alternative embodiments.

In one embodiment of a process for plating the substrate panel 100, the panel may be immersed in a plating bath including metal ions in an aqueous solution. A current is then supplied to the plating bars 116, which current travels through the plating bars 116, through the tails 118 and to the solder pads 110, through-holes 112 and/or contact fingers 106. When the current is delivered, plating bars 116, tails 118, pads 110, through-holes 112 and fingers 106 are electrified and a charge is created at their surface. The metal ions are attracted to the electrified and charged metal areas. A thin film of metal is thus plated onto the shorted areas of the conductance pattern. The thickness of the plated film may vary, but in embodiments may be between 10 μm and 50 μm, though it may be thinner or thicker than that in alternative embodiments. Other known methods for electroplating a metal film on the conductance pattern(s) may be used in alternative embodiments.

In the embodiment shown in FIG. 4, all areas to be plated are shorted together. It is understood that two or more of the areas to be plated may be electrically isolated from each other. In such embodiments, current may be provided to each such shorted area. In such embodiments, it may also be possible to obtain different plating film thicknesses by applying more current, or the same current for longer periods of time, in some areas relative to other areas. Thus, for example, it may be possible to obtain thicker plating at the contact fingers than at the solder pads and through-holes. It is also known that the contact fingers may be plated with two layers: one soft gold layer and one hard gold layer to enhance the performance of the contact fingers. One layer may be used on the contact fingers in embodiments.

After plating of the substrate is complete, each of the electrical terminals must be electrically isolated from each other. As explained in the Background of the Invention section, this was done conventionally by completely removing the plating bar, with the result of a wide kerf width between package outlines. In accordance with embodiments of the present invention, the plating bar 116 is not necessarily removed, but is instead severed at locations along its length to ensure that each of the electrical terminals is electrically isolated from each other.

Figure 5:
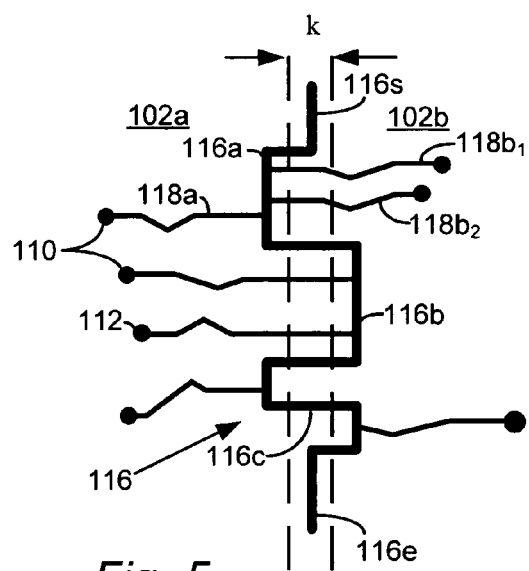
FIG. 5 is a top view of a portion of a semiconductor die substrate including a section of a plating bar according to an embodiment of the present invention.

In one embodiment shown in FIG. 4 and the enlarged sectional view of FIG. 5, the plating bar 116 may have a stepped configuration. The shape of the plating bar 116 may be defined in the pattern mask during the photolithography process. The plating bar 116 may have sections in both of adjoining package outlines 102a and 102b, which sections are connected together by transverse connectors to maintain electrical continuity. Thus, the plating bar 116 may include one or more sections 116a that reside in package outline 102a and one or more sections 116b that reside in package outline 102b. In accordance with embodiments of the invention, a given section in one of the package outlines may have a single tail 118 which terminates in that same package outline, and a plurality of tails 118 that terminate in the adjoining package outline. For example, section 116a in package outline 102a may have a single tail 118a which terminates in package outline 102a. However, the section 116a may have a plurality of tails $118b_1$ and $118b_2$ which terminate in the adjoining package outline, package outline 102b in the embodiment shown.

Figure 6:
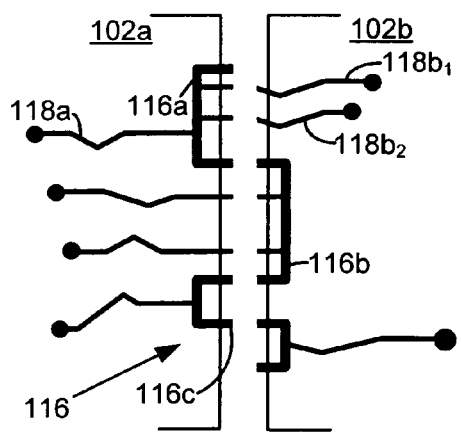
FIG. 6 is a top view of the semiconductor die substrate of FIG. 5 showing the section of plating bar removed.

With such a configuration, when a cut is made between the package outlines 102a and 102b, the cut will sever the transverse connectors 116c between all sections 116a and 116b, thus electrically isolating each of the electrical terminals from each other, as shown in FIG. 6. Tails $118b_1$ and $118b_2$ and their associated electrical terminals are electrically isolated as shown. Similarly, tail 118a and its electrical terminal are electrically isolated.

As used herein and as explained in greater detail below, the term "cut" may refer to separating package outline 102a from package outline 102b, or the term "cut" may instead refer to severing the plating bar on one or both sides of the substrate without cutting through the substrate. The spacing between plating bar sections 116a and 116b across the boundary between adjoining package outlines is preferably at least as great as the tolerance of the cut to be made. This assures that the transverse connectors of the plating bar joining the sections 116a, 116b across the boundary between package outlines will be severed during the cut.

The sections 116a and 116b in the respective package outlines may remain in the package outlines 102a, 102b, respectively, after they are severed by the cut, along with a small portion of any tail terminating in the adjoining package outline. The sections and small tail portions would at most be connected to a single electrical terminal. For example, section 116a shown in FIG. 6 remains in package outline 102a after the cut, along with a small section of tails $118b_1$ and $118b_2$. Tail 118a and its electrical terminal extend from and remain coupled to this section 116a, but the electrical terminal is still electrically isolated from all other electrical terminals. No two terminals are shorted together. (In an alternative embodiment, it is contemplated that two terminals may be intentionally shorted together).

Figure 7:
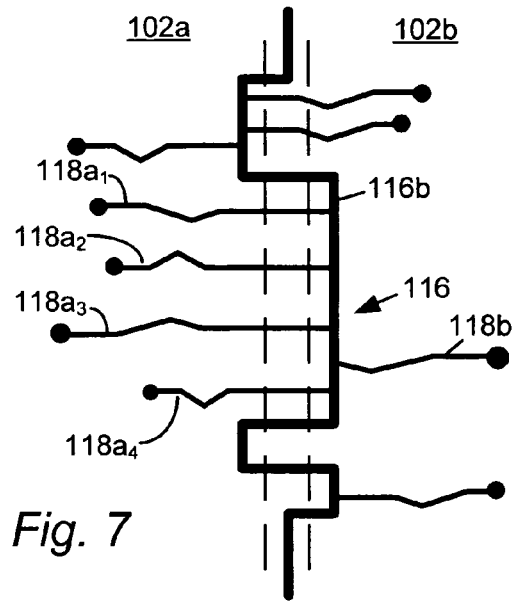
FIG. 7 is a top view of a portion of a semiconductor die substrate including a section of a plating bar according to an alternative embodiment of the present invention.
Figure 8:
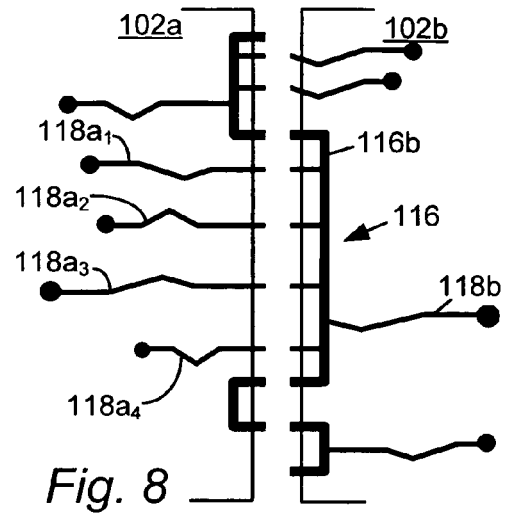
FIG. 8 is a top view of the semiconductor die substrate of FIG. 7 showing the section of plating bar removed.

FIGS. 5 and 6 illustrate an embodiment including two tails $118b_1$ and $118b_2$ which extend from a single section and terminate in the adjoining package outline. However, it is understood that a single section may include any desired number of tails that terminate in the adjoining package outline (zero, one or more than one). For example, FIGS. 7 and 8 illustrate an embodiment including a section 116b having four tails $118a_1$, $118a_2$, $118a_3$ and $118a_4$ which terminate in package outline 102a. More than four such tails are contemplated in alternative embodiments. As indicated above, the section 116b in package outline 102b of FIGS. 7 and 8 may include one tail terminating in that same package outline (tail 118b), although section 116b may have no tail terminating in package outline 102b in alternative embodiments.

Figure 9:
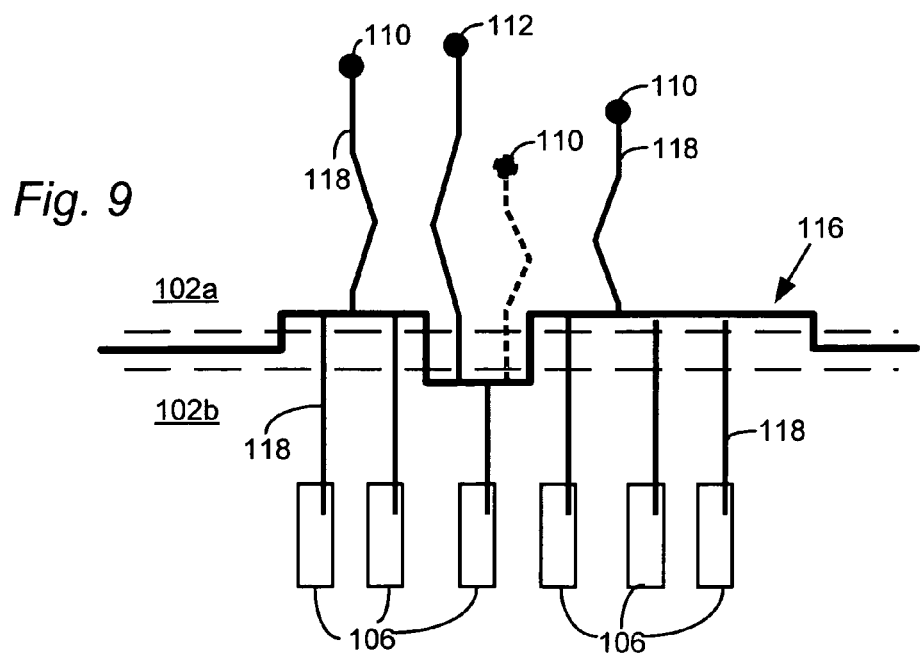
FIG. 9 is a top view of a portion of a semiconductor die substrate including a section of a plating bar according to an embodiment of the present invention.

The electrical terminals shown in package outlines 102a and 102b in FIGS. 5 through 8 may be solder pads 110, through-holes 112 or other electrical terminals. It is understood that the electrical terminals in package outlines 102a and/or 102b may alternatively or additionally be contact fingers 106, as shown in FIG. 9. In FIG. 9, the tails 118 from the contact fingers 106 travel to the plating bar 116 above the contact fingers 106. It is understood that one or more of the contact finger tails 118 may travel to the plating bars to one or both sides of the contact fingers 106 in alternative embodiments. The plating bars 116 in such embodiments would be configured to isolate each of the contact fingers 106 and other electrical terminals in such embodiments as described above.

Referring again to FIG. 5, a length of plating bar 116 between a pair of package outlines 102 may have a starting section 116s and/or an ending section 116e that resides between the two adjoining package outlines as shown. These centered sections may be removed or they may remain after the cut, depending on where the cut is made. Regardless of whether the centered sections are removed or remain, there will be at most one electrical terminal which remains coupled to a given centered section 116s, 116e after the cut. It is understood that one or both of the sections 116s and 116e may reside in one of the package outlines 102a, 102b, instead of residing between the package outlines 102a, 102b, in alternative embodiments. Moreover, it is understood that a section of the plating bar along the length of the plating bar between the starting section 116s and ending section 116e may additionally reside in between the two adjoining package outlines, instead of within the package outlines, in alternative embodiments.

In a further embodiment (not shown), the plating bar 116 may have a stepped configuration with a first group of one or more sections residing in one of a pair of adjoining package outlines, and a second group of one or more sections residing in the boundary between the pair of adjoining package outlines. The first and second groups of sections may be joined by transverse connectors as described above to maintain electrical continuity during the plating process.

As shown in FIG. 4, the ending section 116e between a pair of adjoining package outlines is connected to the starting section 116s of the next adjacent pair of adjoining package outlines (both vertically and horizontally across the substrate panel). Thus all plating bars 116 are electrically coupled together (in embodiments) before being cut. As indicated, one or more sections of the substrate panel may include plating bars which are electrically isolated from each other in alternative embodiments.

In the embodiments shown in FIGS. 5 through 8, the sections 116a and 116b of plating bar 116 extend generally parallel to the nearest adjacent edge of the package outline in which the section resides. The transverse connectors 116c between the sections 116a and 116b which are severed during the cut may extend generally perpendicularly between the sections 116a and 116b. However, in alternative embodiments, the sections 116a, 116b need not be generally parallel to the adjacent edges of the package outlines, and the transverse connectors 116c need not be generally perpendicular to the adjacent edges of the package outline. Such an embodiment is shown in FIGS. 10 and 11.

Figure 10:
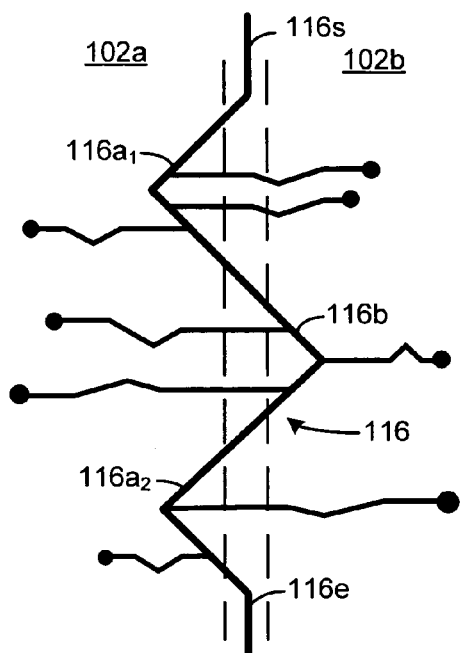
FIG. 10 is a top view of a portion of a semiconductor die substrate including a section of a plating bar according to an alternative embodiment of the present invention.
Figure 11:
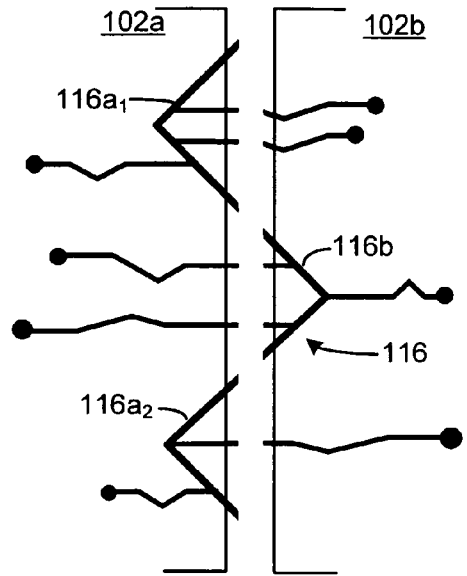
FIG. 11 is a top view of the semiconductor die substrate of FIG. 10 showing the section of plating bar removed.

In FIG. 10, the plating bar 116 includes a starting section 116s between package outlines 102a, 102b, a first section 116a, formed of diagonal lines residing in package outline 102a, a second section 116b formed of diagonal lines residing in package outline 102b, a third section $116a_2$ formed of diagonal lines residing in package outline 102a and an ending section 116e between package outlines 102a, 102b. Although there are no distinct transverse connectors in the embodiment of FIG. 10, when a cut is made between the package outlines 102a, 102b, each of the first, second and third sections of plating bar 116 are severed from each other, and each of the electrical terminals are electrically isolated from each other, as shown in FIG. 11. It is understood that plating bar 116 for two adjoining package outlines 102 may have straight sections (parallel or perpendicular to the nearest package outline edges) and diagonal sections at any oblique angle to the nearest adjacent package outline edges. One or more sections of the plating bar may alternatively or additionally be rounded in further embodiments.

Having a stepped, diagonal or rounded shaped plating bar as shown in FIGS. 4 through 11 and described above provides an advantage that the kerf width, k, between adjoining package outlines may have a thinner width than known in the prior art. First, as it is not necessary to remove the plating bar, the width of the cutting device need not be greater than the width of the plating bar, and in fact may be thinner than the width of the plating bar. Second, because portions of the plating bar pass across the boundary between adjoining package outlines, even if the path of the cutting device varies from straight due to engineering tolerances, the cut will still sever the plating bar sections between adjoining package outlines to isolate the electrical terminals.

Thus, the kerf width between adjoining package outlines may be reduced because the width of the cutting device may be made smaller and the space previously required for engineering tolerances may be omitted. In embodiments, reducing the width of the cutting device and omitting the tolerance widths may allow reduction of the boundary between adjoining package outlines by between 100 μm to 300 μm, and more particularly between 150 μm to 250 μm, and more particularly, 200 μm. It is understood that the reduction in the boundary width may be less than 100 μm or more than 300 μm in alternative embodiments.

The size of the substrate panel is generally selected by the semiconductor package manufacturer, and the size of the substrate panel is not typically selected for a particular number of package outlines. The size is set, and then as many package outlines as will fit on that size are provided. If the density of package outlines is maximized on a given size substrate panel, it rarely works out that a whole number of package outlines fit on the substrate panel. Instead, maximizing the density results in a given number of whole package outlines, and fractions of package outlines at the side and bottom edges. For example, a substrate panel may fit 10½ package outlines across a length of the panel. Obviously, ½ of a semiconductor package cannot be fabricated. Thus, conventionally, in this example, 10 such packages would be formed on the substrate panel, and the 10 are spread out across the length of the panel (i.e., the boundary between packages is increased).

However, by reducing the boundary between adjoining package outlines in accordance with the present invention by, for example, 200 µm, a panel having 10 such boundaries may reclaim 2 mm of space across the length of the panel (200 µm×10). Thus, in an example where 10½ package outlines were previously obtainable in a given size panel (which was conventionally reduced to 10 packages), the present invention allows the additional ½ package outline to fit on the panel, thus allowing 11 packages. These numbers are by way of example, but in general, the present invention may allow a fraction of a package outline to be turned into a whole package outline. The addition of even a single row and/or column of semiconductor packages within a given size panel would result in a tremendous increase in package yields.

Figure 12:
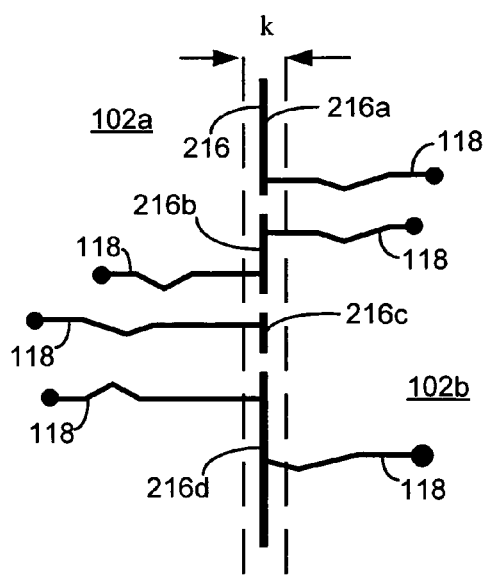
FIG. 12 is a top view of a portion of a semiconductor die substrate including a section of a plating bar according to an alternative embodiment of the present invention.
Figure 13:
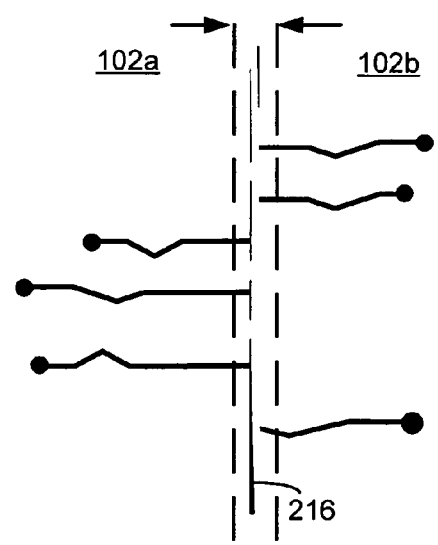
FIG. 13 is a top view of the semiconductor die substrate of FIG. 12 showing the section of plating bar removed.

In the embodiments described with respect to FIGS. 4 through 11, the plating bar 116 is formed of discontinuous and/or curved sections, some of which pass across the boundary between adjoining package outlines. A further embodiment of the present invention is shown in FIGS. 12 and 13. In this embodiment, a plating bar 216 is a straight line without discontinuous sections, as in the prior art. However, in this embodiment, after the plating process is complete, two series of cuts are made across the substrate panel 100. A first series of cuts are made transverse to the plating bar to break the plating bar into discrete sections. In FIG. 12, four discrete plating bar sections 216a, 216b, 216c and 216d are shown. Each section may include a single tail 118 extending into one of adjoining package outlines 102a, 102b, or two tails 118, one extending into package outline 102a and one extending into package outline 102b.

The second series of cuts includes a single cut between each adjoining package outline to separate package outline 102a from package outline 102b. The cut may leave slivers or portions of the plating bar 216 as shown in FIG. 13. Even if slivers or portions are left, the first series of cuts ensures that each electrical terminal in the package outlines 102a and 102b will be electrically isolated after the second series of cuts.

As indicated above, the plating bar 116 may be cut by separating adjoining package outlines, or by severing the plating bar 116 without cutting through the substrate panel 100. In embodiments, after the plating process, the plating bar 116 may remain intact for the remainder of the semiconductor package. Once the panel is encapsulated as explained hereinafter, the panel may be singulated into individual semiconductor packages. In such embodiments, the plating bars may be cut when the packages are singulated. The packages may be singulated, and the plating bars cut, by a variety of severing methods used to singulate semiconductor packages.

Sawing is generally less expensive, less time consuming and requires less equipment than other cutting methods, and may be used to singulate the semiconductor packages. However, it is understood that the panel 100 may be singulated by a variety of cutting methods in alternative embodiments, such as for example, water jet cutting, laser cutting, water guided laser cutting, dry media cutting, and diamond coated wire. Water can also be used together with laser cutting to help complement or focus its effects. While the semiconductor packages are shown as square or rectangular, they may additionally or alternatively have irregular or curvilinear shapes in alternative embodiments. A further description of the cutting of semiconductor packages from a panel and the shapes which may be achieved thereby is disclosed in published U.S. Application No. 2004/0259291, entitled, "Method For Efficiently Producing Removable Peripheral Cards," which application is assigned to the owner of the present invention and which application has been incorporated by reference herein in its entirety.

In embodiments, after the plating process, the plating bars 116 may be severed without cutting through the substrate panel 100. A router may be used to sever the plating bar 116 without cutting through the substrate panel as is known in the art.

A substrate panel 100 including plating bars, tails and electrical terminals as described above may be used in a semiconductor package 130 as shown in FIG. 14. After plating of the conductance patterns on the substrate panel 100, one or more passive devices 132 and semiconductor die 134 may be mounted on the substrate panel. Although not critical to the present invention, the semiconductor die 134 may a flash memory chip (NOR/NAND), SRAM or DDT, and/or a controller chip such as an ASIC. Other silicon chips are contemplated.

The one or more die 134 may be electrically connected to the substrate panel 100 by wire bonds 136 soldered at the plated solder pads 110 in a known wire bond process. Thereafter, the substrate and die may be encased within a molding compound 138 in a known encapsulation process to form a finished semiconductor die package 130. The molding compound may be applied according to various processes, including by transfer molding or injection molding techniques, to encapsulate the package.

FIG. 15 is a rear view of a flash memory device 140 in which the semiconductor package 130 may be used. The flash memory device may be an SD Card, a Compact Flash, a Smart Media, a Mini SD Card, an MMC, an xD Card, a Transflash or a Memory Stick. Other devices are contemplated.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A substrate panel for fabricating semiconductor packages, the substrate panel including first and second adjacent package outlines defining locations for formation of first and second semiconductor packages, the substrate panel comprising:
a section of plating bar having a first severed end and a second severed end, the section of plating bar including at least a portion in the first section in the first package outline; and one or more severed electrical trace portions different than the plating bar section, each electrical trace portion having a first end at a point where the electrical trace portion connects to the plating bar section in the first package outline and a second severed end, opposite the first end, extending toward the second package outline;

an electrical trace having a first end connected to the section of plating bar and extending into and terminating in the first package outline.

2. A substrate panel as recited in claim 1, wherein the first and second severed ends of the plating bar section and the second ends of the one or more severed electrical traces terminate in a boundary between the first and second adjacent package outlines.

3. A substrate panel as recited in claim 1, wherein the portion of the plating bar section in the first package outline is generally parallel to an adjacent edge of the first package outline.

4. A substrate panel as recited in claim 1, the portion of the plating bar section comprising a first portion of the plating bar section, the plating bar section including a second portion extending between the first severed end and the first portion of the plating bar section, the second portion of the plating bar extending at a right angle to the first portion of the plating bar section.

5. A substrate panel as recited in claim 1, the portion of the plating bar section comprising a first portion of the plating bar section, the plating bar section including a second portion extending between the first severed end and the first portion of the plating bar section, the second portion of the plating bar extending at an oblique angle to the first portion of the plating bar section.

6. A substrate panel for fabricating semiconductor packages, the substrate panel including first and second adjacent package outlines defining locations for a formation of first and second semiconductor packages, the substrate panel comprising:

a first plating bar section including a first severed end and a second severed end, the first plating bar section including:
  a first portion in the first package outline, and
  a second portion extending between the first severed end of the first plating bar section and the first portion of the plating bar section;

a first plurality of severed electrical trace portions, each electrical trace portion of the first plurality of severed electrical trace portions having a first end connected to the first plating bar section and a second, severed end extending toward the second package outline; and a first electrical trace having a first end connected to the first plating bar section and extending into and terminating in the first package outline;

a second plating bar section including a first severed end and a second severed end, the first plating bar section including:
  a third portion in the second package outline, and
  a fourth portion extending between the first severed end of the second plating bar section and the third portion of the plating bar section;

a second plurality of severed electrical trace portions, each electrical trace portion of the second plurality of severed electrical trace portions having a first end connected to the second plating bar section and a second, severed end extending toward the first package outline; and a second electrical trace having a first end connected to the second plating bar section and extending into and terminating in the second package outline.

7. A substrate panel as recited in claim 6, wherein the first and second sections of the plating bar are different lengths.

8. A substrate panel as recited in claim 6, wherein the first electrical trace extending from the first plating bar section terminates at least one of a contact finger, a solder pad and a through-hole on the panel.

9. A substrate panel as recited in claim 6, wherein the first and second electrical terminals are plated with gold.

10. A substrate panel as recited in claim 6, wherein the first portion of the first plating bar section is generally parallel to an adjacent edge of the first package outline and the third portion of the second plating bar section is generally parallel to an adjacent edge of the second package outline.

11. A substrate panel as recited in claim 6, the second portion of the first plating bar section and the fourth portion of the second plating bar section extending generally perpendicularly from the first portion of the first plating bar section the third portion of the second plating bar sections.

12. A substrate panel as recited in claim 6, the second portion of the first plating bar section and the fourth portion of the second plating bar section extending at an oblique angle from the first portion of the first plating bar section the third portion of the second plating bar sections.

13. A substrate panel as recited in claim 6, the first and second package outlines including generally parallel adjacent edges defining a boundary between the first and second package outlines, the second ends of the first plurality of severed electrical trace portions terminating in the boundary between the first and second package outlines.

14. A substrate panel as recited in claim 13, wherein the second ends of the second plurality of severed electrical trace portions terminating in the boundary between the first and second package outlines.

15. A semiconductor package singulated from a substrate panel, comprising:

a plating bar section adjacent a first edge of the semiconductor package and including a first severed end terminating at the first edge of the package and a second severed end terminating at the first edge of the package;

a plurality of severed electrical trace portions, each electrical trace portion having a first end connected to the plating bar section and a second severed end, opposite the first end, extending toward the first edge of the package; and an electrical trace different than the plating bar section and extending from the plating bar section, the electrical trace connecting to the plating bar section and terminating at an electrical terminal in the semiconductor package.

16. A semiconductor package as recited in claim 15, the semiconductor package being one of a land grid array package and a ball grid array package.

17. A flash memory, comprising:

a plating bar section adjacent a first edge of the flash memory and including a first severed end terminating at the first edge of the flash memory and a second severed end terminating at the first edge of the flash memory;

a plurality of severed electrical trace portions, each electrical trace portion having a first end connected to the plating bar section and a second severed end, opposite the first end, extending toward the first edge of the flash memory; and an electrical trace different than the plating bar section and extending from the plating bar section, the electrical trace connecting to the plating bar section and terminating at an electrical terminal in the flash memory.

18. A flash memory as recited in claim 17, the flash memory being one of an SD Card, a Compact Flash, a Smart Media, a Mini SD Card, an MMC, an xD Card, a Transflash or a Memory Stick.

* * * * *